(12) United States Patent
Lim

(10) Patent No.: US 11,317,049 B2
(45) Date of Patent: Apr. 26, 2022

(54) IMAGE SENSOR DEVICE AND OPERATION METHOD THEREOF

(71) Applicant: Samsung Electronics Co., Ltd., Suwon-si (KR)

(72) Inventor: Jungwook Lim, Hwasung-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 229 days.

(21) Appl. No.: 16/690,741

(22) Filed: Nov. 21, 2019

(65) Prior Publication Data
US 2020/0322558 A1 Oct. 8, 2020

(30) Foreign Application Priority Data
Apr. 8, 2019 (KR) .................. 10-2019-0040957

(51) Int. Cl.
*H04N 5/378* (2011.01)
*H04N 3/14* (2006.01)
*H01L 27/146* (2006.01)
*H04N 5/374* (2011.01)

(52) U.S. Cl.
CPC ....... *H04N 5/378* (2013.01); *H01L 27/14641* (2013.01); *H04N 3/155* (2013.01); *H04N 5/374* (2013.01)

(58) Field of Classification Search
CPC ...................................... H04N 5/378
USPC ...................................... 348/222.1
See application file for complete search history.

(56) References Cited

U.S. PATENT DOCUMENTS

| | | |
|---|---|---|
| 6,459,078 B1 | 10/2002 | Fowler |
| 6,919,551 B2 | 7/2005 | Barna et al. |
| 7,652,704 B2 | 1/2010 | Mauritzson et al. |
| 7,804,537 B2 | 9/2010 | Storm et al. |
| 7,911,512 B2 | 3/2011 | Henderson |
| 8,665,350 B2 | 3/2014 | Richardson et al. |
| 9,154,750 B2 | 10/2015 | Pang |
| 9,191,598 B2 | 11/2015 | Blanquart et al. |
| 10,715,756 B1 * | 7/2020 | Tsai ................. H04N 5/374 |
| 2018/0351450 A1 | 12/2018 | Pelicia et al. |

* cited by examiner

*Primary Examiner* — Joel W Fosselman

(74) *Attorney, Agent, or Firm* — Harness, Dickey & Pierce, P.L.C.

(57) ABSTRACT

An image sensor device includes a pixel that converts a light signal into an electrical signal and outputs the converted electrical signal through a data line, a current bias element that is connected between the data line and a ground voltage, and a self-pull-down circuit that is connected between the data line and the ground voltage and pulls down the data line based on an output voltage of the data line.

20 Claims, 15 Drawing Sheets

IMAGE SENSOR DEVICE AND OPERATION METHOD THEREOF

CROSS-REFERENCE TO RELATED APPLICATIONS

This application claims priority under 35 U.S.C. § 119 to Korean Patent Application No. 10-2019-0040957 filed on Apr. 8, 2019, in the Korean Intellectual Property Office, the disclosures of which are incorporated by reference herein in their entireties.

TECHNICAL FIELD

Embodiments of the inventive concepts described herein relate to image sensors, and more particularly, relate to image sensor devices and operation methods thereof.

BACKGROUND

An image sensor converts a light incident from the outside into an electrical signal. An image sensor is generally classified as a complementary metal-oxide-semiconductor (CMOS) image sensor or a charge coupled device (CCD) image sensor. Because it is possible to manufacture the CMOS image sensor through a general-purpose semiconductor manufacturing device, the CMOS image sensor may be relatively inexpensive compared with the CCD image sensor. The CCD image sensor may obtain an image quality that is improved compared with the CMOS image sensor.

As the resolution of image data increases, the number of pixels of the image sensor increases, and a time (e.g., a 1H time) taken to read data from the image sensor decreases. That is, as the time to read image data decreases and the number of pixels increases, various noises occur in the image sensors. For this reason, various techniques are being developed for solving this issue.

SUMMARY

Example embodiments of the inventive concepts provide image sensors having improved reliability and improved performance and operation methods thereof.

According to some example embodiments, an image sensor device includes a pixel that converts a light signal into an electrical signal and outputs the converted electrical signal through a data line, a current bias element that is connected between the data line and a ground voltage, and a self-pull-down circuit that is connected between the data line and the ground voltage and configured to down the data line based on an output voltage of the data line.

According to some example embodiments, an image sensor device includes a row driver that outputs pixel control signals, a first pixel that is connected with a first data line, and being configured to, in response to the pixel control signals, convert a first light signal into a first electrical signal and output the first electrical signal through the first data line, a second pixel that is connected with a second data line, and being configured to, in response to the pixel control signals, convert a second light signal into a second electrical signal and output the second electrical signal through the second data line, a first self-pull-down circuit that is connected between the first data line and a ground voltage and operates in response to a first output voltage of the first data line, and a second self-pull-down circuit that is connected between the second data line and the ground voltage and operates in response to a second output voltage of the second data line.

According to some example embodiments, an operation method of an image sensor device which includes a pixel configured to convert a light signal into an electrical signal and to output the converted electrical signal through a data line includes performing a reset operation on the pixel, performing a reset sampling operation on the data line to generate reset data, performing a transfer operation on the pixel, and performing a pixel sampling operation on the data line to generate pixel data. Performing a self-pull-down operation for the data line when an output voltage of the data line is greater than or equal to a reference voltage, based on a first period from a time when the reset operation is performed to a time when the reset sampling operation is initiated or a second period from a time when the transfer operation is performed to a time when the pixel sampling operation is initiated.

BRIEF DESCRIPTION OF THE FIGURES

The above and other objects and features of the inventive concepts will become apparent by describing in detail some example embodiments thereof with reference to the accompanying drawings.

DETAILED DESCRIPTION

Below, example embodiments of the inventive concepts may be described in detail and clearly to such an extent that an ordinary one in the art easily implements the inventive concepts.

In the detailed description, components or function blocks corresponding to terms such as "block", "unit", "logic", etc. may include hardware such as logic circuits; a hardware/software combination, such as a processor executing software; or a combination thereof. For example, a processor may include, but is not limited to, a central processing unit (CPU), a graphics processing unit (GPU), an arithmetic logic unit (ALU), a digital signal processor, a microcomputer, a field programmable gate array (FPGA), a System-on-Chip (SoC), a programmable logic unit, a microprocessor, an application-specific integrated circuit (ASIC), etc.

Figure 1:
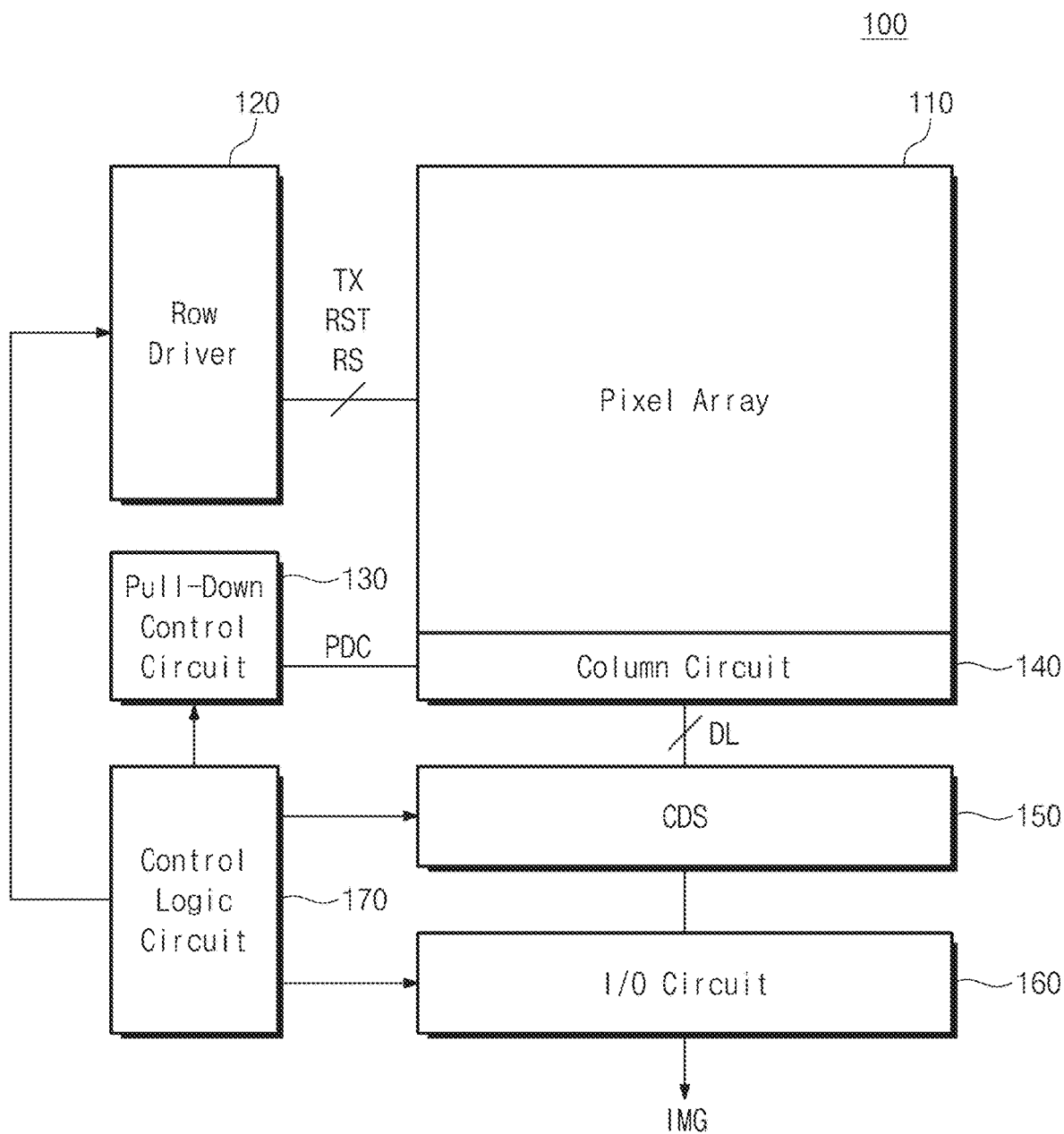
FIG. 1 is a block diagram illustrating an image sensor device according to some example embodiments.

FIG. 1 is a block diagram illustrating an image sensor device according to some example embodiments. Referring to FIG. 1, an image sensor device 100 may include a pixel array 110, a row driver 120, a pull-down control circuit 130, a column circuit 140, a correlated double sampling circuit (CDS) 150, an input/output circuit 160, and a control logic circuit 170.

The pixel array 110 may include a plurality of image pixels (hereinafter briefly referred to as "pixels") arranged in a row direction and a column direction. Each of the pixels may be configured to operate in response to various signals (e.g., TX, RST, and RS) from the row driver 120. For example, each of the pixels may receive light from an external object and may output an electrical signal corresponding to the received light.

The row driver 120 may be connected with the pixel array 110 through a plurality of signal lines. The row driver 120 may provide transfer signals TX, reset signals RST, and row select signals RS to the plurality of pixels of the pixel array 110 through the plurality of signal lines.

The pull-down control circuit 130 may be configured to output a pull-down control signal PDC (hereinafter briefly referred to as a "pull-down signal"). The pull-down signal PDC may be used to maintain signal levels of data lines connected with the pixel array 110 at a certain level or to pull down the signal levels. For example, the column circuit 140 may be connected with data lines from the pixel array 110. In response to the pull-down signal PDC, the column circuit 140 may maintain a signal level of each of the data lines DL at the certain level or may pull down the signal level thereof. Configurations and operations of the pull-down control circuit 130 and the column circuit 140 will be more fully described with reference to the following drawings.

The CDS 150 may be connected with the pixel array 110 through the data lines DL. The CDS 150 may sample an electrical signal (i.e., an analog signal) of each of the data lines DL and may convert the sampled electrical signal into a digital signal. For example, the CDS 150 may perform a reset sampling operation and a pixel sampling operation and may output a difference between result values of the sampling operations as a pixel value (i.e., a digital signal).

The input/output circuit 160 may combine pixel values (i.e., digital signals) received from the CDS 150 and may output a result of the combination as final image data IMG.

The control logic circuit 170 may control overall operations of the image sensor device 100. For example, the control logic circuit 170 may control the row driver 120, the pull-down control circuit 130, the column circuit 140, the CDS 150, and the input/output circuit 160 to generate the image data IMG.

Figure 2:
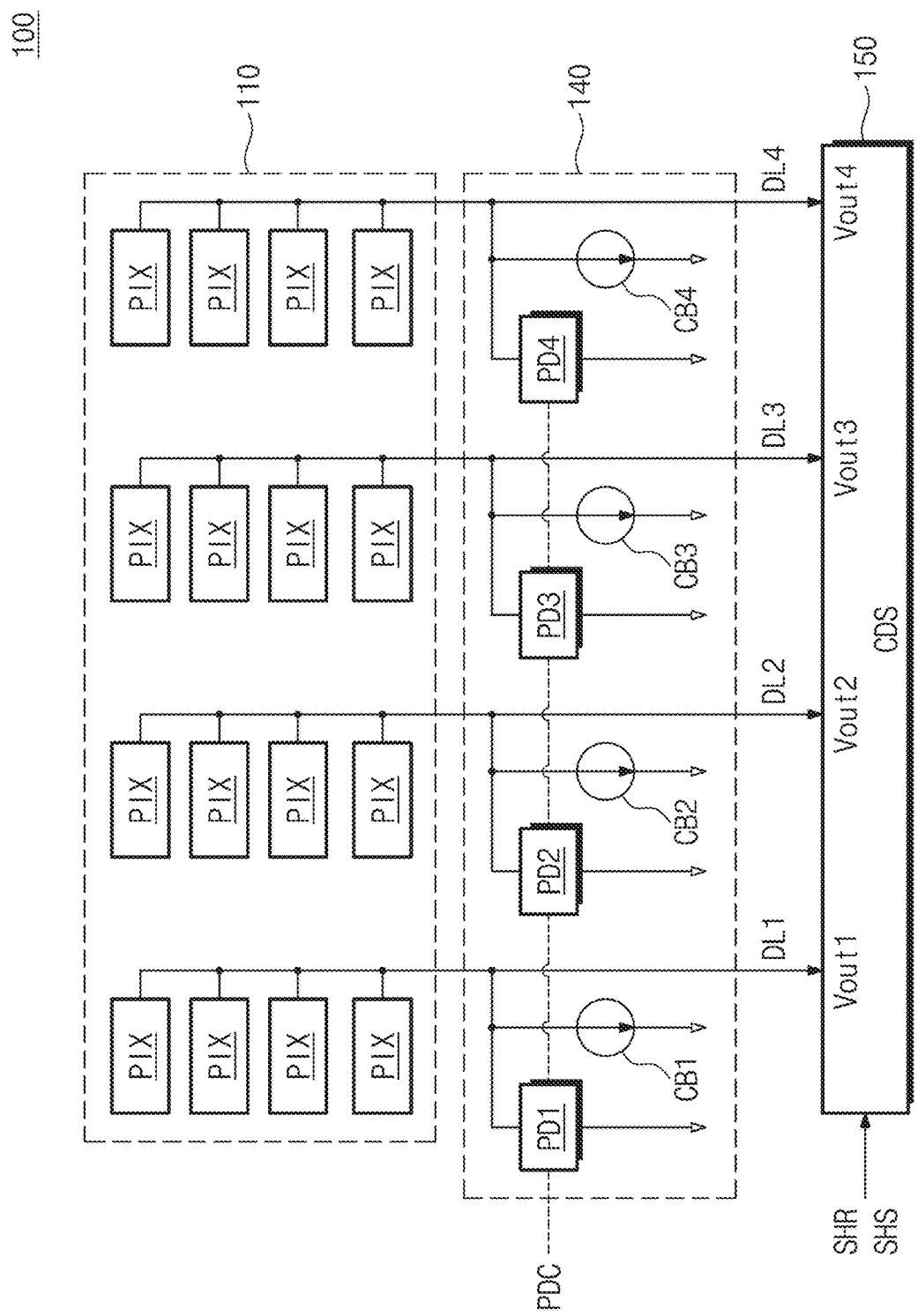
FIG. 2 is a diagram illustrating a partial configuration of an image sensor device of FIG. 1.

FIG. 2 is a diagram illustrating a partial configuration of an image sensor device of FIG. 1. For brevity of illustration and for convenience of description, a partial configuration of the image sensor device 100 is illustrated, but the configurations are not limited thereto. Also, an example embodiment is illustrated as a plurality of pixels PIX of the pixel array 110 are arranged in a 4×4 matrix, but the inventive concepts are not limited thereto. For example, the pixel array 110 may include additional pixels that are further arranged in the row direction or the column direction.

Referring to FIGS. 1 and 2, the image sensor device 100 may include the pixel array 110, the column circuit 140, and the CDS 150. The pixel array 110 may include the plurality of pixels PIX. Pixels placed at a first column from among the plurality of pixels PIX may be connected with a first data line DL1, pixels placed at a second column from among the plurality of pixels PIX may be connected with a second data line DL2, pixels placed at a third column from among the plurality of pixels PIX may be connected with a third data line DL3, and pixels placed at a fourth column from among the plurality of pixels PIX may be connected with a fourth data line DL4.

In some example embodiments, the pixel array 110 may include various shapes of color filter arrays. For example, the pixel array 110 may include a color filter array configured to allow each pixel to receive a light signal corresponding to a given color. In some example embodiments, the color filter array may include at least one of various color filter array patterns such as a Bayer pattern, an RGBE pattern, a CYYM pattern, a CYGM pattern, a BGBW Bayer pattern, a BGBW pattern, and a tetra pattern.

The column circuit 140 may include first to fourth current bias elements CB1 to CB4 and first to fourth pull-down circuits PD1 to PD4. The first current bias element CB1 and the first pull-down circuit PD1 may be connected with the first data line DL1, the second current bias element CB2 and the second pull-down circuit PD2 may be connected with the second data line DL2, the third current bias element CB3 and the third pull-down circuit PD3 may be connected with the third data line DL3, and the fourth current bias element CB4 and the fourth pull-down circuit PD4 may be connected with the fourth data line DL4.

The first to fourth current bias elements CB1 to CB4 may be used to maintain the first to fourth data lines DL1 to DL4 at a certain signal level, respectively. The first to fourth current bias elements CB1 to CB4 may be implemented with a current source and may be used to pull down levels of the first to fourth data lines DL1 to DL4, respectively.

The first to fourth pull-down circuits PD1 to PD4 may respectively pull down levels of the first to fourth data lines DL1 to DL4 in response to the pull-down signal PDC. For example, at a certain timing, it may be necessary to quickly pull down levels of the first to fourth data lines DL1 to DL4 in order to read an accurate pixel value. In this case, the first to fourth pull-down circuits PD1 to PD4 may perform a pull-down operation together with the first to fourth current bias elements CB1 to CB4, and thus, levels of the first to fourth data lines DL1 to DL4 may be quickly pulled down.

The CDS 150 may be connected with the first to fourth data lines DL1 to DL4. In response to a reset sampling signal SHR and a pixel sampling signal SHS from the control logic circuit 170, the CDS 150 may sample (i.e., may perform digital signal conversion on) first to fourth output voltages Vout1 to Vout4 from the first to fourth data lines DL1 to DL4, respectively.

Figure 3:
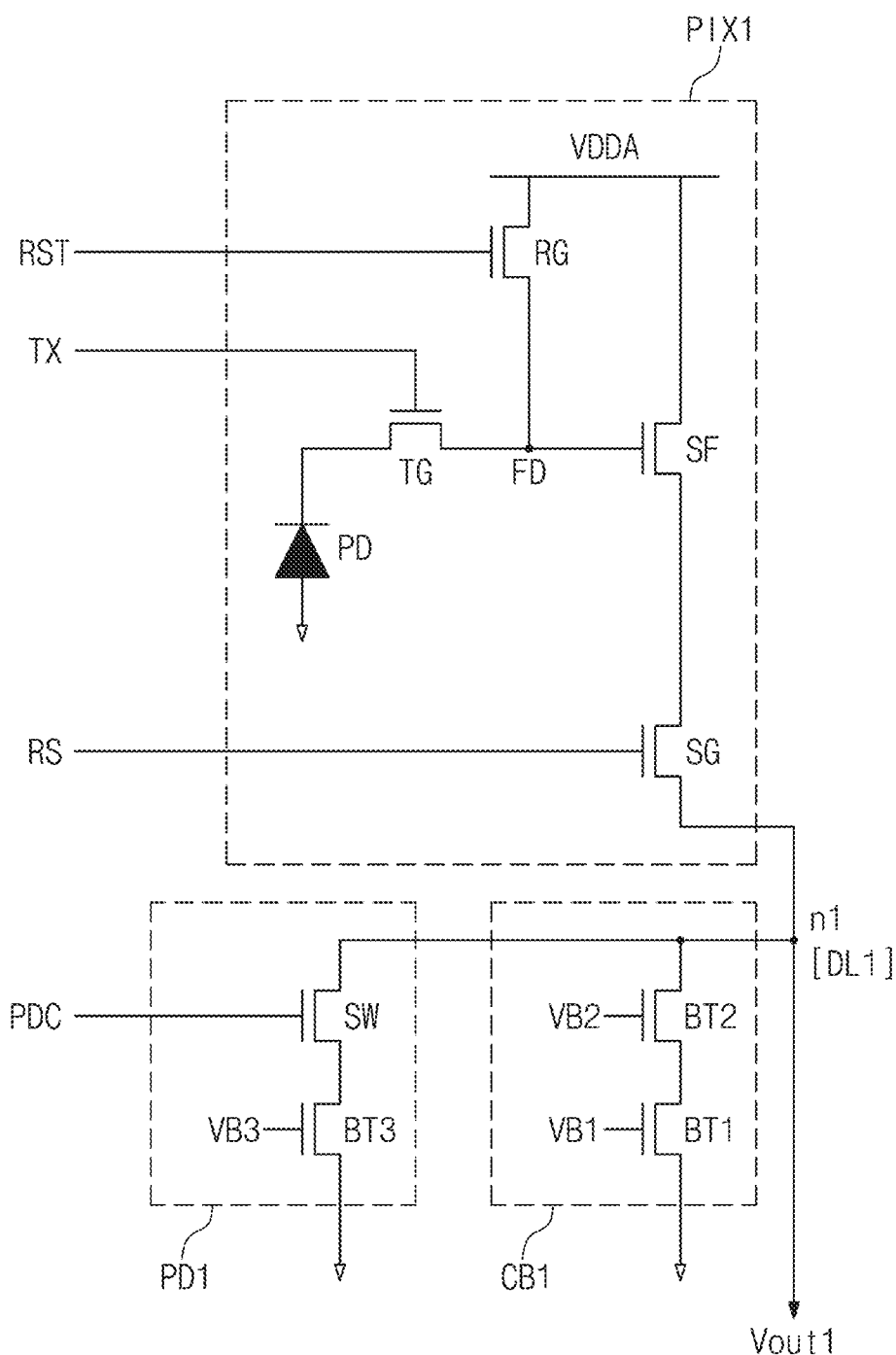
FIG. 3 is a diagram illustrating a partial configuration of an image sensor device of FIG. 2 in detail.
Figure 4:
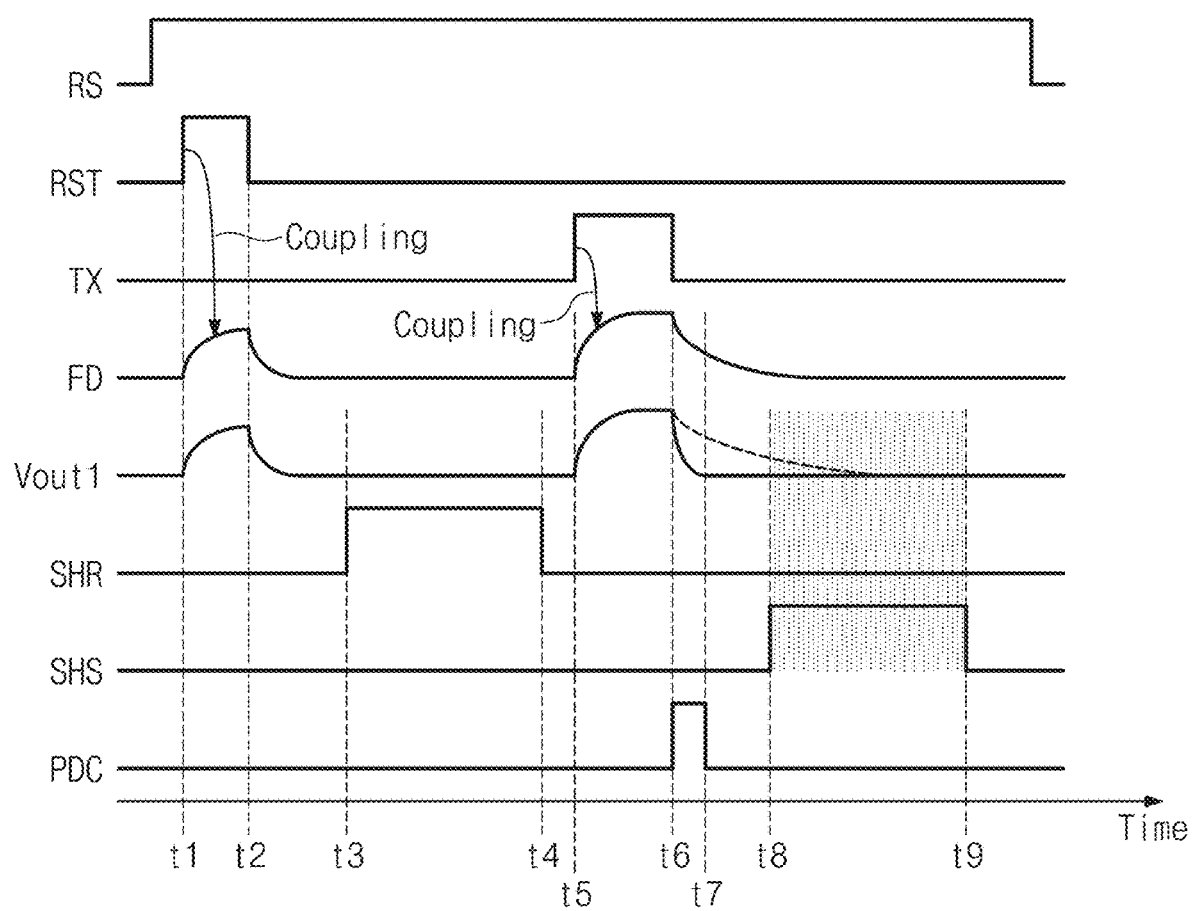
FIG. 4 is a timing diagram for describing operations of some components of an image sensor device of FIG. 3.

FIG. 3 is a diagram illustrating a partial configuration of an image sensor device of FIG. 2 in detail. FIG. 4 is a timing diagram for describing operations of some components of an image sensor device of FIG. 3. For brevity of illustration and for convenience of description, components that are unnecessary to describe example embodiments of the inventive concepts are omitted. Also, the timing diagram of FIG. 4 is illustrated for exemplary purposes, and actual driving waveforms of the image sensor device 100 may be different from waveforms illustrated in FIG. 4.

For brevity of illustration and for convenience of description, waveforms illustrated in FIG. 4 show signal waveforms in a dark state (i.e., a state where a first pixel PIX1 does not receive a light). However, the inventive concepts are not limited thereto. For example, a voltage level of a floating diffusion node FD or a level of the first output voltage Vout1 may be variously changed according to the amount of light incident on the first pixel PIX1.

Referring to FIGS. 1, 3, and 4, the first pixel PIX1 may output the first output voltage Vout1 through the first data line DL1 in response to the reset signal RST, the transfer signal TX, and the row select signal RS from the row driver 120.

The first pixel PIX1 may include a photodiode PD, a transfer gate TG, a reset gate RG, a source follower SF, and a select gate SG. In an example embodiment, the first pixel PIX1 is a pixel of a 4TR-1PD structure, but the inventive concepts are not limited thereto. For example, pixels included in the pixel array 110 may be variously changed or modified to other configurations as known to one of ordinary skill in the art.

The photodiode PD may be configured to accumulate charges in response to a light signal received from the outside.

The transfer gate TG may be connected between the photodiode PD and the floating diffusion node FD and may operate in response to the transfer signal TX from the row driver 120. For example, the transfer gate TG may be turned on in response to the transfer signal TX of logical high, and thus, charges may be transferred from the photodiode PD to the floating diffusion node FD. In this case, a voltage of the floating diffusion node FD may decrease.

The reset gate RG may be connected between a power supply voltage VDDA and the floating diffusion node FD and may operate in response to the reset signal RST from the row driver 120. For example, the reset gate RG may be turned on in response to the reset signal RST of logical high, and thus, the floating diffusion node FD may be charged with the power supply voltage VDDA.

The source follower SF may be connected between the power supply voltage VDDA and the select gate SG and may operate in response to a voltage of the floating diffusion node FD. For example, the source follower SF may be configured to transfer a voltage corresponding to a variation in a voltage of the floating diffusion node FD to the select gate SG.

The select gate SG may be connected between the source follower SF and a first node n1 (i.e., the first data line DL1) and may operate in response to the row select signal RS from the row driver 120. For example, the select gate SG may transfer a signal (i.e., a voltage corresponding to a variation in a voltage of the floating diffusion node FD) from the source follower SF to the first node n1 in response to the row select signal RS of logical high.

The first current bias element CB1 and the first pull-down circuit PD1 may be connected to the first node n1. The first current bias element CB1 and the first pull-down circuit PD1 may be configured to pull down a voltage of the first node n1.

For example, the first current bias element CB1 may include first and second bias transistors BT1 and BT2. The first and second bias transistors BT1 and BT2 may be connected in series between the first node n1 and a ground voltage and may operate in response to first and second bias voltages VB1 and VB2, respectively. In some example embodiments, the first current bias element CB1 may be a current source.

The first pull-down circuit PD1 may include a third bias transistor BT3 and a pull-down switch SW. The third bias transistor BT3 may operate in response to a third bias voltage VB3. The pull-down switch SW may operate in response to the pull-down signal PDC from the pull-down control circuit 130. For example, the pull-down switch SW may be turned on in response to the pull-down signal PDC of logical high, and thus, a voltage of the first node n1 may be pulled down.

For example, as illustrated in FIG. 4, the row select signal RS may transition to logical high for the purpose of reading a pixel value of the first pixel PIX1.

Afterwards, at a first time t1, the reset signal RST may transition to logical high for the purpose of resetting a voltage level of the floating diffusion node FD. As the reset signal RST is turned on in response to the reset signal RST, a voltage level of the floating diffusion node FD may be reset. In some example embodiments, a voltage level of the floating diffusion node FD may temporarily increase due to the coupling with the reset signal RST transitioning to logical high. In this case, the first output voltage Vout1 (i.e., a voltage of the first node n1 or a voltage of the first data line DL1) may also temporarily increase.

At a second time t2, the reset signal RST may transition to logical low, and thus, the voltage of the floating diffusion node FD temporarily increased due to the coupling may decrease to a certain level. As the voltage of the floating diffusion node FD decreases, the first output voltage Vout1 of the first data line DL1 may decrease to a reset level.

In some example embodiments, the reset level may indicate an output voltage of a data line in a state where the floating diffusion node FD is charged with the power supply voltage VDDA or is reset. Alternatively, the reset level may indicate an output voltage of a data line when a light is not incident on a plurality of pixels included in the pixel array 110 (i.e., in the case of a dark state).

Afterwards, from a third time t3 to a fourth time t4, the reset sampling signal SHR may be maintained at logical high. The CDS 150 may sample the first output voltage Vout1 during a period (i.e., from t3 to t4) where the reset sampling signal SHR is at logical high. In this period, sampled digital data may be reset data corresponding to the reset level.

At a fifth time t5, the transfer signal TX may transition to logical high. The transfer gate TG may be turned on in response to the transfer signal TX of logical high, and thus, charges may be transferred from the photodiode PD to the floating diffusion node FD.

In some example embodiments, a voltage level of the floating diffusion node FD may temporarily increase due to the coupling with the transfer signal TX transitioning to logical high. In this case, a voltage level of the first output voltage Vout1 may temporarily increase due to the voltage increase of the floating diffusion node FD.

At a fifth time t6, the transfer signal TX may transition to logical low. As the transfer signal TX transitions to logical low, the voltage of the floating diffusion node FD temporarily increased may slowly decrease.

During a time period from an eighth time t8 to a ninth time t9, the pixel sampling signal SHS may be maintained at logical high, and the CDS 150 may perform the pixel sampling operation in response to the pixel sampling signal SHS of logical high.

In some example embodiments, the voltage of the floating diffusion node FD, which is temporarily increased due to the coupling with the transfer signal TX transitioning to logical high, may slowly decrease after the transfer signal TX transitions to logical low. In this case, a level of the first output voltage Vout1 may also slowly decrease. That is, due to the coupling with the transfer signal TX, the first output voltage Vout1 may decrease along a dotted line of FIG. 4. In this case, at the eighth time t8 when the pixel sampling operation is initiated, the first output voltage Vout1 fails to reach a normal state, thereby reducing the reliability of the pixel sampling operation. In some example embodiments, that the first output voltage Vout1 is in the normal state means that the first output voltage Vout1 reaches a level corresponding to a pixel value of the first pixel PIX1.

In this case, the first pull-down circuit PD1 may pull down the first output voltage Vout1, thus stabilizing the first output voltage Vout1 quickly. During a time period from a sixth time t6 to a seventh time t7, the pull-down signal PDC may be maintained at logical high. In response to the pull-down signal PDC of logical high, the pull-down switch SW of the first pull-down circuit PD1 may be turned on, and thus, the first output voltage Vout1 may be quickly pulled down (or stabilized). In this case, at the eighth time t8 when the pixel sampling operation is initiated, the first output voltage Vout1 may be stabilized, and thus, the reliability of the pixel sampling operation may be improved.

In some example embodiments, the first output voltage Vout1 of the first data line DL1 pulled down by the first pull-down circuit PD1 may be lower than or equal to the reset level. For example, in the example embodiment illustrated in FIG. 4, the first pixel PIX1 may be in a dark state where a light signal is not received. In this case, because charges are not generated by the photodiode PD of the first pixel PIX1, a voltage of the floating diffusion node FD before the transfer gate TG is turned on may be identical to a voltage of the floating diffusion node FD after the transfer gate TG is turned on. That is, in the dark state, reset data and pixel data sampled by the CDS 150 may be identical to each other.

However, the inventive concepts are not limited thereto, when a light signal is received by the first pixel PIX1, the first output voltage Vout1 after the transfer gate TG is turned on may be lower than the first output voltage Vout1 before the transfer gate TG is turned on. In this case, the reset data and the pixel data sampled by the CDS 150 may be different from each other.

The example embodiments are above exemplified for describing example embodiments of the inventive concepts clearly, but the inventive concepts are not limited thereto. For example, the first output voltage Vout1 may not only vary with a voltage change of the floating diffusion node FD, but it may have an influence of the coupling with signal levels of various different control signals (e.g., RS, TX, and RST).

Figure 5A:
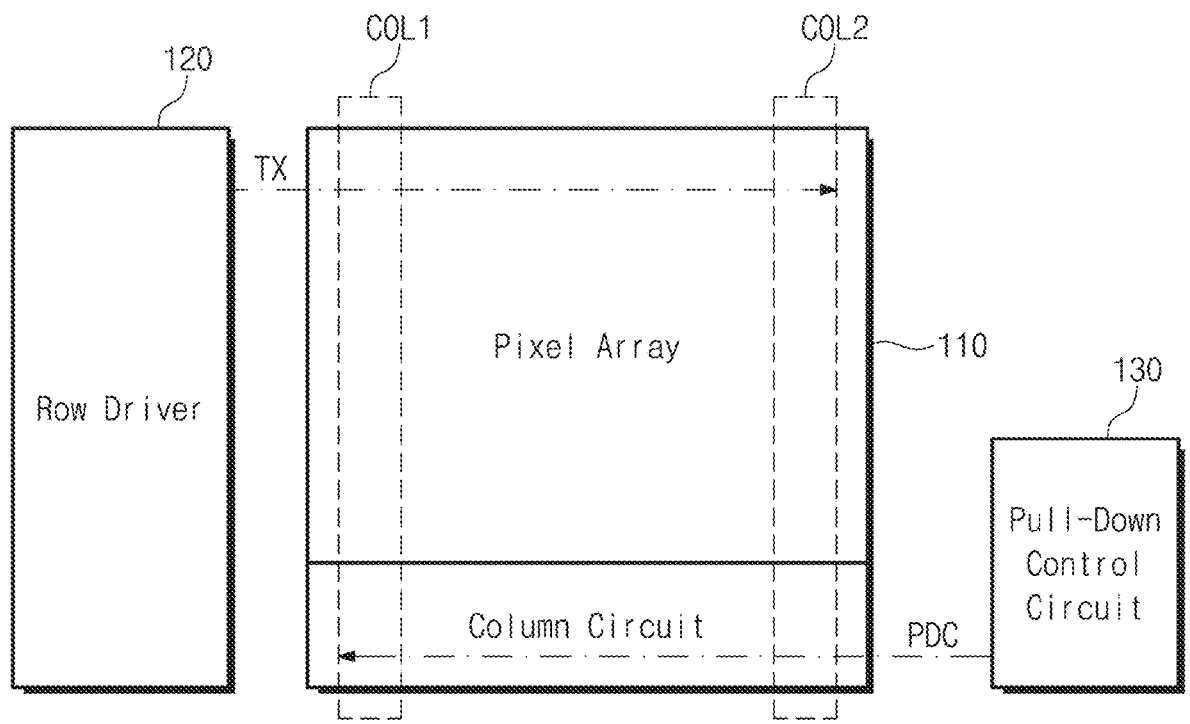
FIGS. 5A and 5B are diagrams for describing some example embodiments and example operations of an image sensor device of FIG. 1.
Figure 5B:
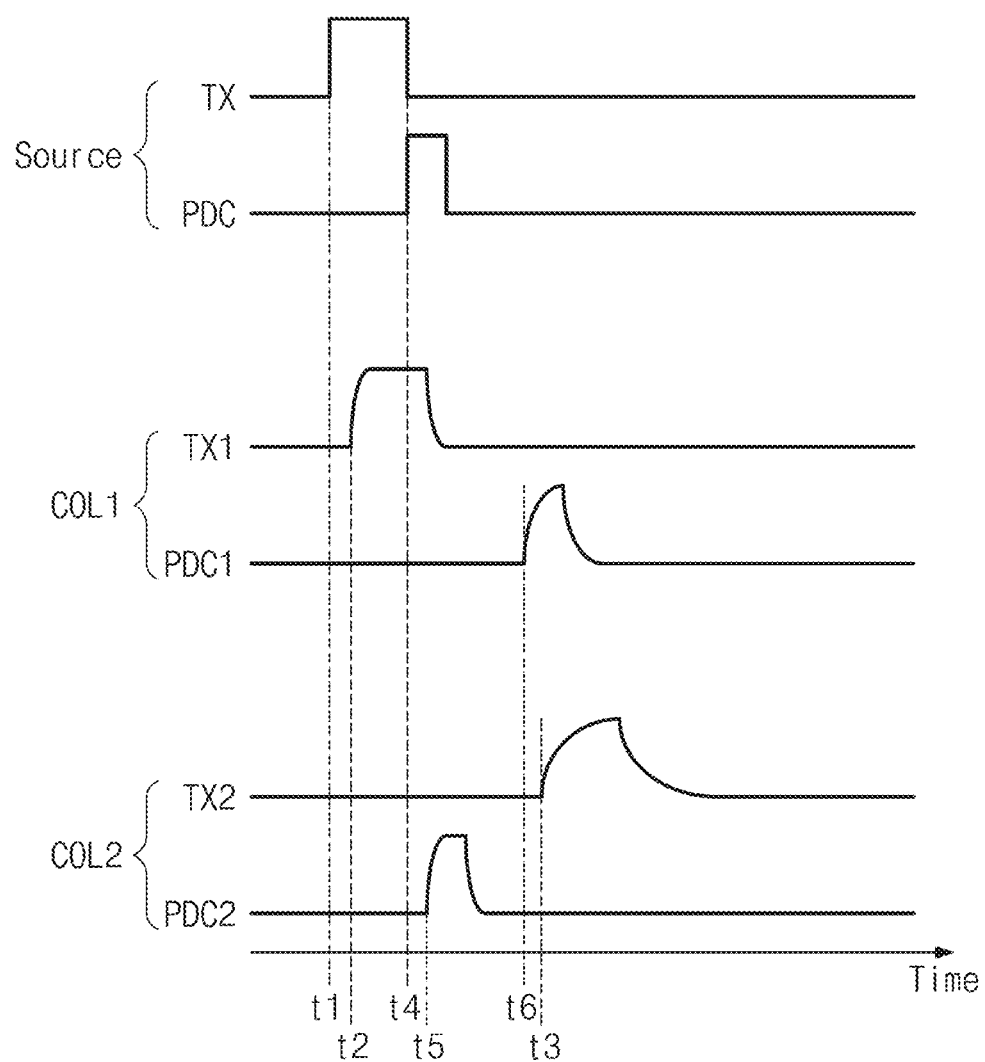

FIGS. 5A and 5B are diagrams for describing some example embodiments and example operations of an image sensor device of FIG. 1. Referring to FIGS. 5A and 5B, the image sensor device 100 may include the pixel array 110, the row driver 120, the pull-down control circuit 130, and the column circuit 140.

As illustrated in FIG. 5A, due to the limited area of the image sensor device 100, the row driver 120 may be placed on one side of the pixel array 110, and the pull-down control circuit 130 may be placed on an opposite side of the pixel array 110. In other words, the row driver 120 may be positioned adjacent to a first column COL1 of the pixel array 110, and the pull-down control circuit 130 may be positioned adjacent to a second column COL2 of the pixel array 110. In this case, the first column COL1 may indicate a first edge area of the pixel array 110, and the second column COL2 may indicate a second edge area of the pixel array 110, which is opposite to the first edge area.

In the layout illustrated in FIG. 5A, the row driver 120 may transfer the transfer signal TX to each of a plurality of pixels of the pixel array 110 through a metal line. In this case, a length of a metal line between a pixel belonging to the second column COL2 and the row driver 120 may be longer than a length of a metal line between a pixel belonging to the first column COL1 and the row driver 120. Even though the row driver 120 outputs the same transfer signal TX, a transfer signal that pixels belonging to the first column COL1 receive and a transfer signal that pixels belonging to the second column COL2 receive may be different from each other.

Likewise, in the layout illustrated in FIG. 5A, the pull-down control circuit 130 may transfer the pull-down signal PDC to each of a plurality of pull-down circuits of the column circuit 140 through s metal line. In this case, a length of a metal line between a pull-down circuit belonging to the first column COL1 and the pull-down control circuit 130 may be longer than a length of a metal line between a pull-down circuit belonging to the second column COL2 and the pull-down control circuit 130. Even though the pull-down control circuit 130 outputs the same pull-down signal PDC, a pull-down signal that a pull-down circuit belonging to the first column COL1 receives and a pull-down signal that a pull-down circuit belonging to the second column COL2 receives may be different from each other.

For example, as illustrated in FIG. 5B, the row driver 120 may output the transfer signal TX that transitions to logical high at a first time t1. In this case, a first transfer signal TX1 that a pixel of the first column COL1 relatively close to the row driver 120 may transition to logical high at a second time t2. A second transfer signal TX2 that a pixel of the second column COL2 relatively distant from the row driver 120 may transition to logical high at a third time t3.

That is, the first transfer signal TX1 that the pixels of the first column COL1 receive and the second transfer signal TX2 that the pixels of the second column COL2 receive may have different delay times. Also, a difference between parasitic capacitance values according to lengths of metal lines may make waveforms of the first transfer signal TX1 and the second transfer signal TX2 different.

The pull-down control circuit 130 may output a pull-down signal PDC that transitions to logical high at a fourth time t4. In this case, a pull-down circuit of the second column COL2 relatively close to the pull-down control circuit 130 may receive a second pull-down signal PDC2 that transitions to logical high at a fifth time t5. A pull-down circuit of the first column COL1 relatively distant from the pull-down control circuit 130 may receive a first pull-down signal PDC1 that transitions to logical high at a sixth time t6.

As described above, even though the transfer signal TX output from the row driver 120 and the pull-down signal PDC output from the pull-down control circuit 130 are output in synchronization with each other, signal distortion may occur depending on an area at which each signal arrives, which makes a normal operation difficult.

Figure 6:
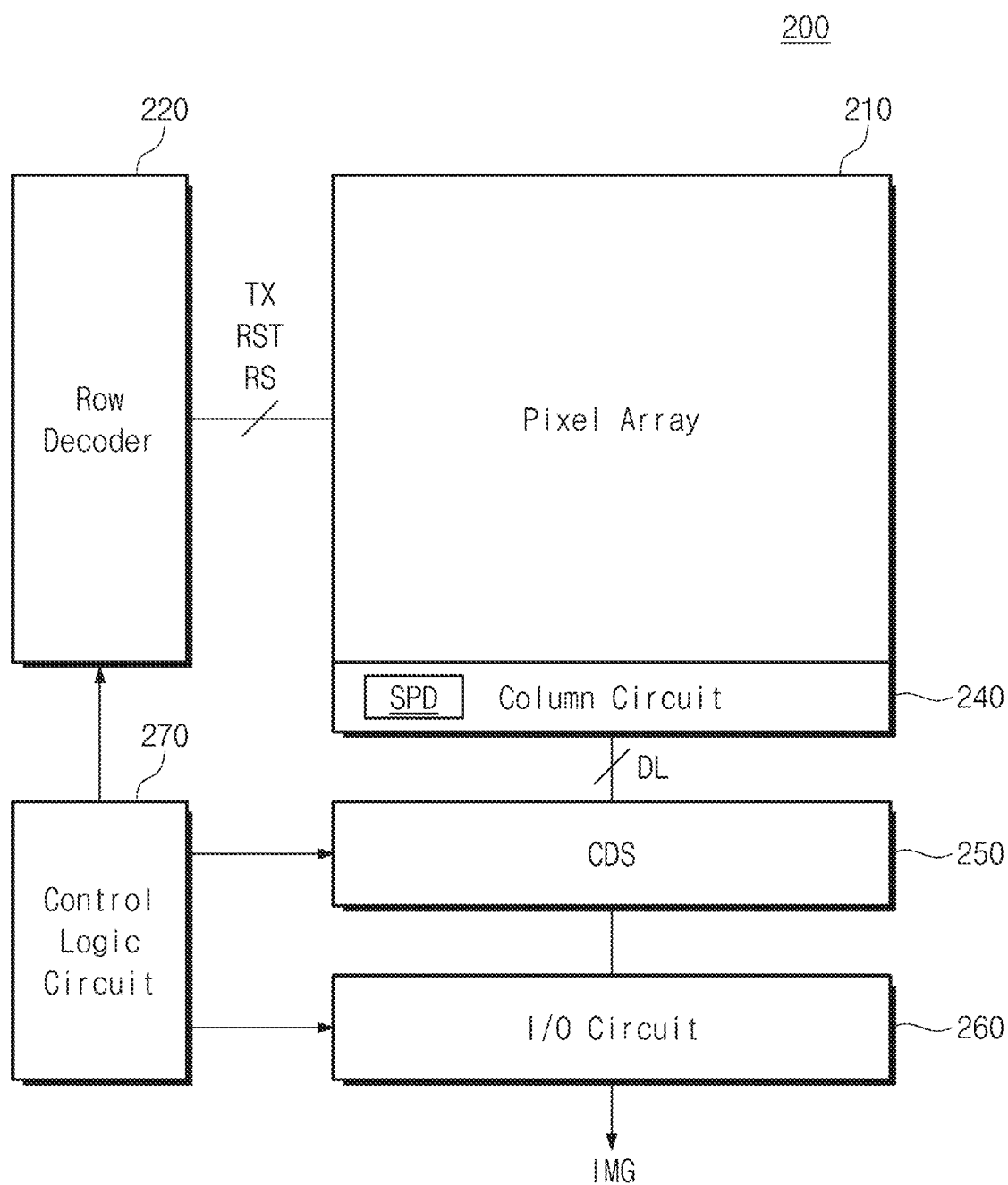
FIG. 6 is a block diagram illustrating an image sensor device according to some example embodiments.

FIG. 6 is a block diagram illustrating an image sensor device according to some example embodiments. For convenience of description, additional description associated with the above-described components will be omitted to avoid redundancy. Referring to FIG. 6, an image sensor device 200 may include a pixel array 210, a row driver 220, a column circuit 240, a CDS 250, an input/output circuit 260, and a control logic circuit 270. The pixel array 210, the row driver 220, the CDS 250, the input/output circuit 260, and the control logic circuit 270 are described with reference to FIG. 3, and thus, additional description will be omitted to avoid redundancy.

In some example embodiments, unlike the example embodiments described with reference to FIGS. 1 to 5B, the column circuit 240 may include a self-pull-down circuit SPD. The pull-down circuit PD described with reference to FIGS. 1 to 5B may operate in response to the pull-down signal PDC received from the separate pull-down control circuit 130. In this case, as described with reference to FIGS. 5A and 5B, because timings of the pull-down signals PDC received from the respective pull-down circuits PD are different, it may be different to perform a normal operation.

In contrast, the self-pull-down circuit SPD according to the example embodiment of FIG. 6 may operate based on a voltage (i.e., an output voltage) of a relevant data line without a separate control signal (e.g., PDC). For example, when a voltage of a relevant data line is a reference voltage or greater, the self-pull-down circuit SPD may pull down a voltage of the relevant data line.

Because the self-pull-down circuit SPD operates individually or independently in response to a voltage of a relevant data line, there may be no need to consider a timing for a separate control signal (e.g., PDC). This may means that the implementation of the image sensor device 200 may be simplified and an error of an output voltage due to the coupling with a certain signal line may be efficiently removed.

Figure 7:
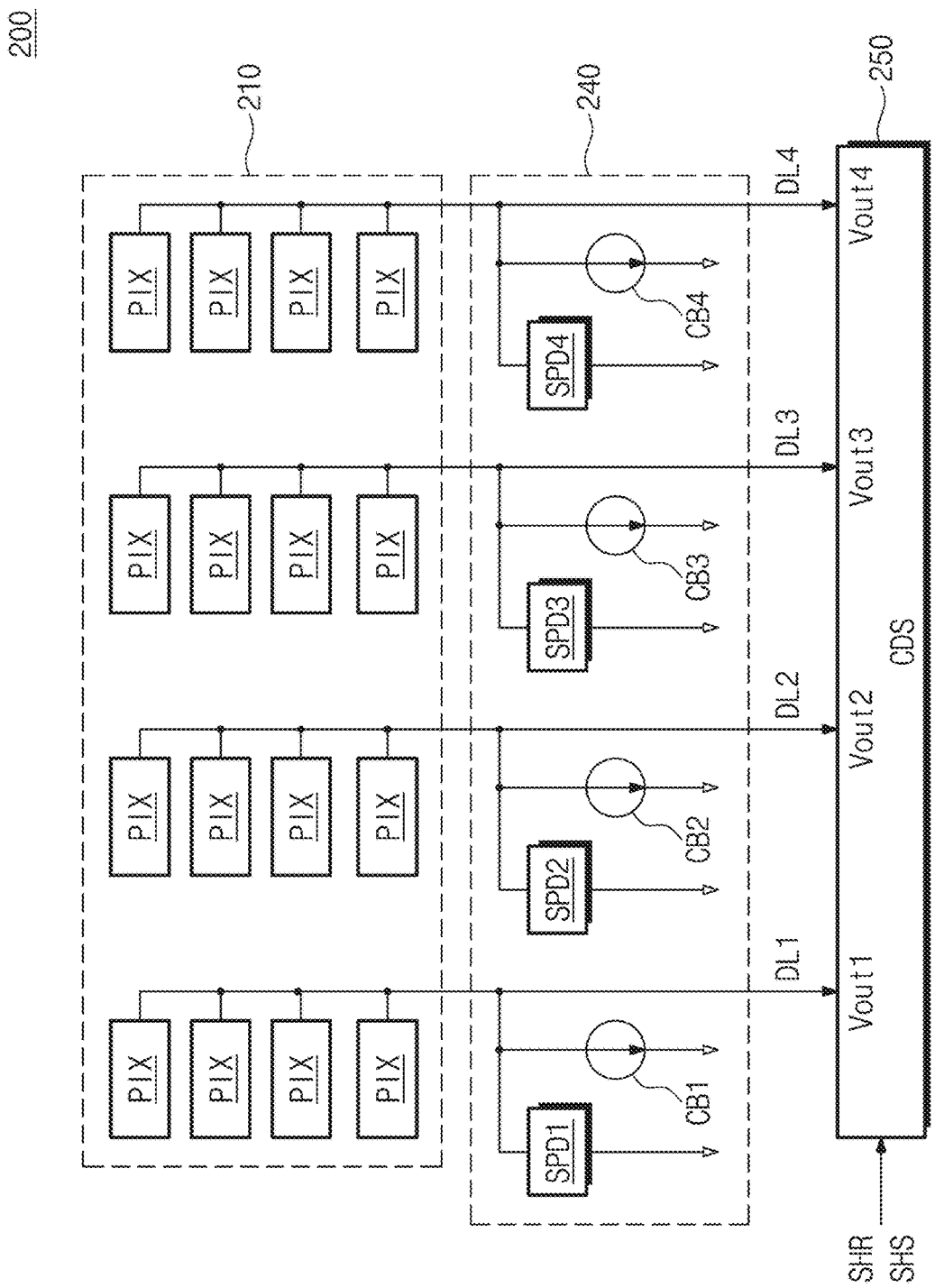
FIG. 7 is a diagram illustrating an image sensor device of FIG. 6.

FIG. 7 is a diagram illustrating an image sensor device of FIG. 6. For brevity of illustration and for convenience of description, with regard to the above-described components, additional description will be omitted to avoid redundancy.

Referring to FIGS. 6 and 7, the image sensor device 200 may include the pixel array 210, the column circuit 240, and the CDS 250. The pixel array 210 may include a plurality of pixels PIX. The column circuit 240 may include the first to fourth current bias elements CB1 to CB4 and first to fourth self-pull-down circuits SPD1 to SPD4. The CDS 250 may be connected with the first to fourth data lines DL1 to DL4. The remaining components are similar to the above-described components, and thus, additional description will be omitted to avoid redundancy.

In some example embodiments, the first to fourth self-pull-down circuits SPD1 to SPD4 may individually or independently pull down the first to fourth data lines DL1 to DL4 in response to voltage levels of the first to fourth data lines DL1 to DL4.

For example, the first self-pull-down circuit SPD1 may pull down the first data line DL1 based on a voltage of the first data line DL1. The second self-pull-down circuit SPD2 may pull down the second data line DL2 based on a voltage of the second data line DL2. The third self-pull-down circuit SPD3 may pull down the third data line DL3 based on a voltage of the third data line DL3. The fourth self-pull-down circuit SPD4 may pull down the fourth data line DL4 based on a voltage of the fourth data line DL4.

Figure 8A:
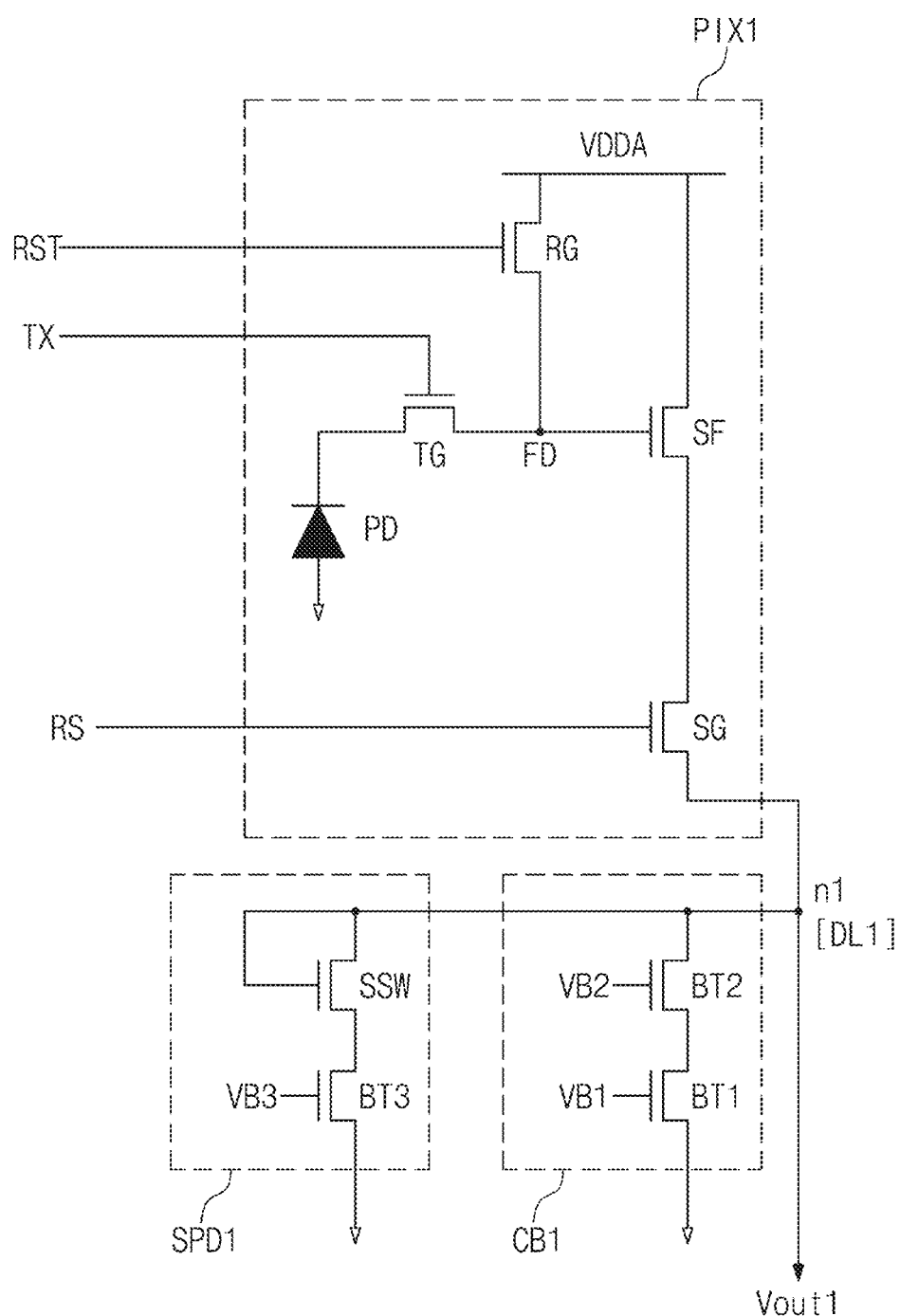
FIG. 8A is a diagram illustrating a partial configuration of an image sensor device of FIG. 7 in detail.
Figure 8B:
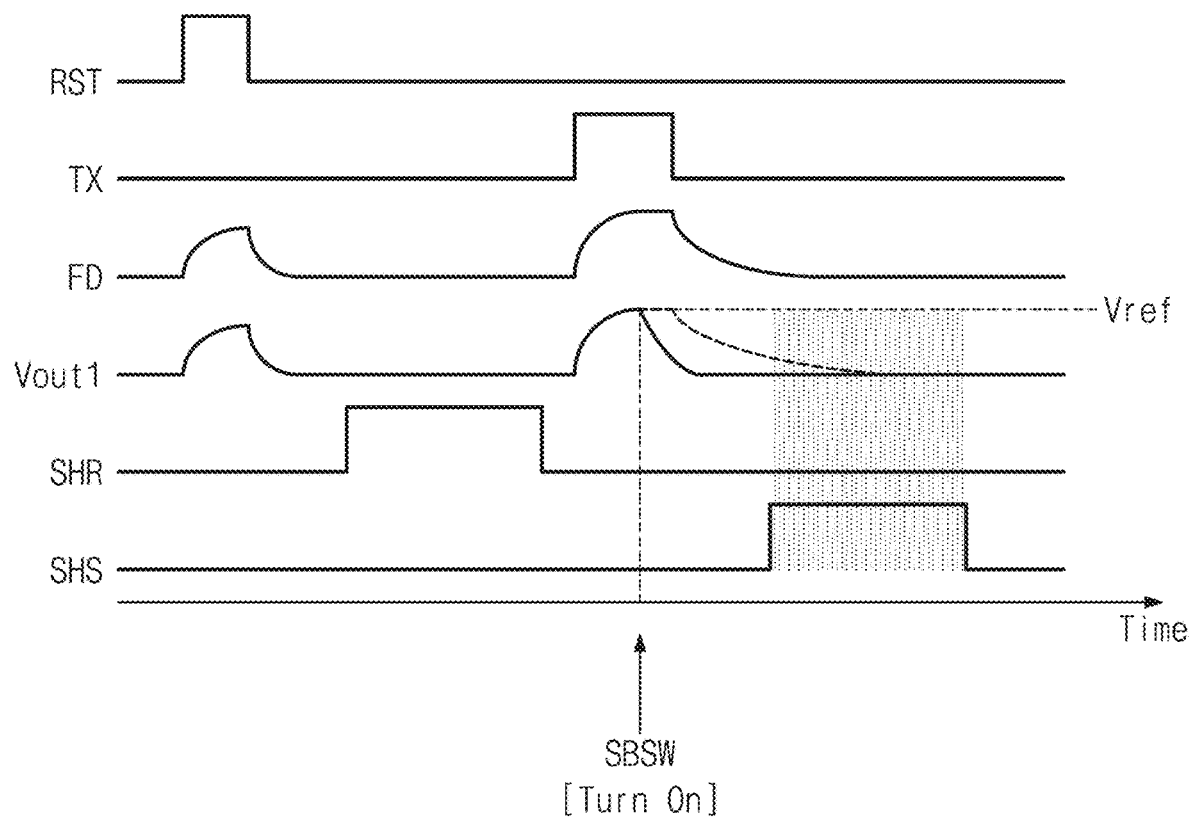
FIG. 8B is a timing diagram for describing example operations of some components of FIG. 5A.

FIG. 8A is a diagram illustrating a partial configuration of an image sensor device of FIG. 7 in detail. FIG. 8B is a timing diagram for describing example operations of some components of FIG. 8A. For brevity of illustration and for convenience of description, components that are unnecessary to describe example embodiments of the inventive concepts are omitted. Also, the timing diagram of FIG. 8B is illustrated for exemplary purposes, and actual driving waveforms of the image sensor device 200 may be different from waveforms illustrated in FIG. 8B.

Referring to FIGS. 6, 8A, and 8B, the first pixel PIX1 may operate the reset signal RST, the transfer signal TX, and the row select signal RS from the row driver 220. The first pixel PIX1 may include the photodiode PD, the transfer gate TG, the reset gate RG, the source follower SF, and the select gate SG. The configuration and the operation components of the first pixel PIX1 are described above, and thus, additional description will be omitted to avoid redundancy.

The first current bias element CB1 may include the first and second bias transistors BT1 and BT2, and the first and second bias transistors BT1 and BT2 may operate in response to the first and second bias voltages VB1 and VB2. The first current bias element CB1 is described above, and thus, additional description will be omitted to avoid redundancy.

The pull-down circuit PD described with reference to FIGS. 1 to 6 may be configured to operate in response to a separate control signal (e.g., PDC). In contrast, the first self-pull-down circuit SPD1 of FIG. 8A may operate in response to a voltage of the first node n1 (i.e., the first output voltage Vout1).

The first self-pull-down circuit SPD1 may include the third bias transistor BT3 and a self-pull-down switch SSW. The third bias transistor BT3 may operate in response to the third bias voltage VB3. The self-pull-down switch SSW may be connected between the first node n1 and the third bias transistor BT3 and may operate in response to a voltage of the first node n1 (i.e., the first output voltage Vout1). For example, when a voltage of the first node n1 (i.e., the first output voltage Vout1) is a reference level or greater, the self-pull-down switch SSW may be turned on, and thus, the voltage of the first node n1 may be pulled down.

In detail, the image sensor device 200 may operate based on the timing diagram illustrated in FIG. 8B. The reset signal RST, the transfer signal TX, the reset sampling signal SHR, and the pixel sampling signal SHS are described above, and thus, additional description will be omitted to avoid redundancy.

As in the above description, as the transfer signal TX transitions to logical high, a voltage of the floating diffusion node FD may temporarily increase by the coupling. A level of the first output voltage Vout1 may temporarily increase due to the voltage increase of the floating diffusion node FD. In this case, at a certain time, the level of the first output voltage Vout1 may reach a reference voltage Vref. When the first output voltage Vout1 reaches the reference voltage Vref, the self-pull-down switch SSW may be turned on, and thus, the first node n1 may be pulled down. That is, when the first output voltage Vout1 reaches the reference voltage Vref, the first output voltage Vout1 may be quickly stabilized by the first self-pull-down circuit SPD1. Accordingly, the pixel sampling operation may be performed based on the stabilized output voltage Vout1.

Some example embodiments in which a voltage of the floating diffusion node FD temporarily increases due to the transfer signal TX transitioning to logical high are described with reference to FIGS. 8A and 8B, but the inventive concepts are not limited thereto. For example, the first output voltage Vout1 or a voltage of the first data line DL1 may temporarily increase due to the direct coupling with various different control signals (e.g., RST, TX, and RS).

Some example embodiments in which the first output voltage Vout1 reaches the reference voltage Vref by the transfer signal TX transitioning to logical high are described with reference to FIGS. 8A and 8B, but the inventive concepts are not limited thereto. For example, as described above, the first output voltage Vout1 may be temporarily increased by the reset signal RST transitioning to logical high. In this case, when the first output voltage Vout1 reaches the reference voltage Vref, the self-pull-down switch SSW may be turned on, and thus, the first output voltage Vout1 may be quickly stabilized.

Figure 9A:
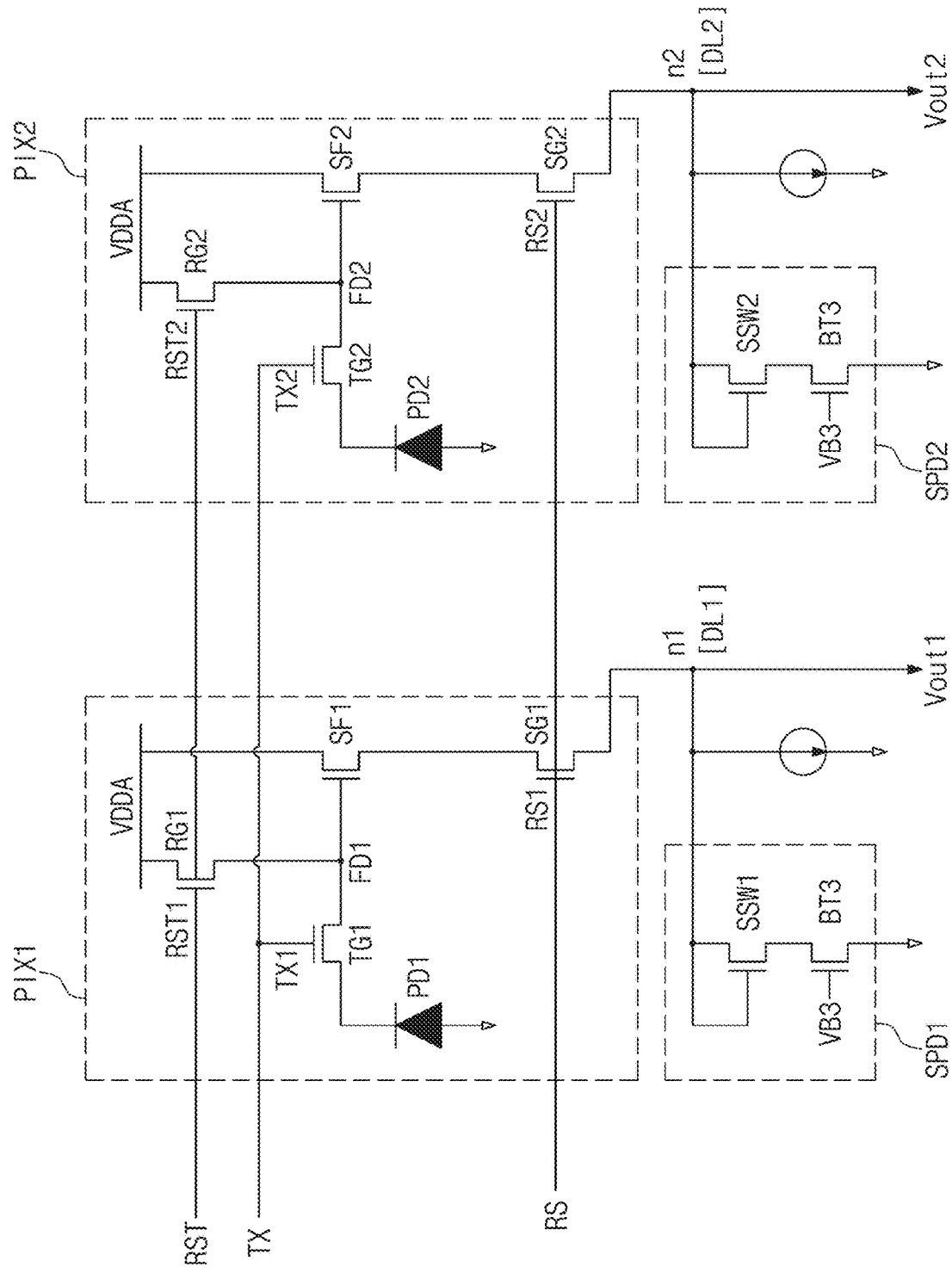
FIG. 9A is a diagram illustrating a partial configuration of an image sensor device of FIG. 7 in detail.
Figure 9B:
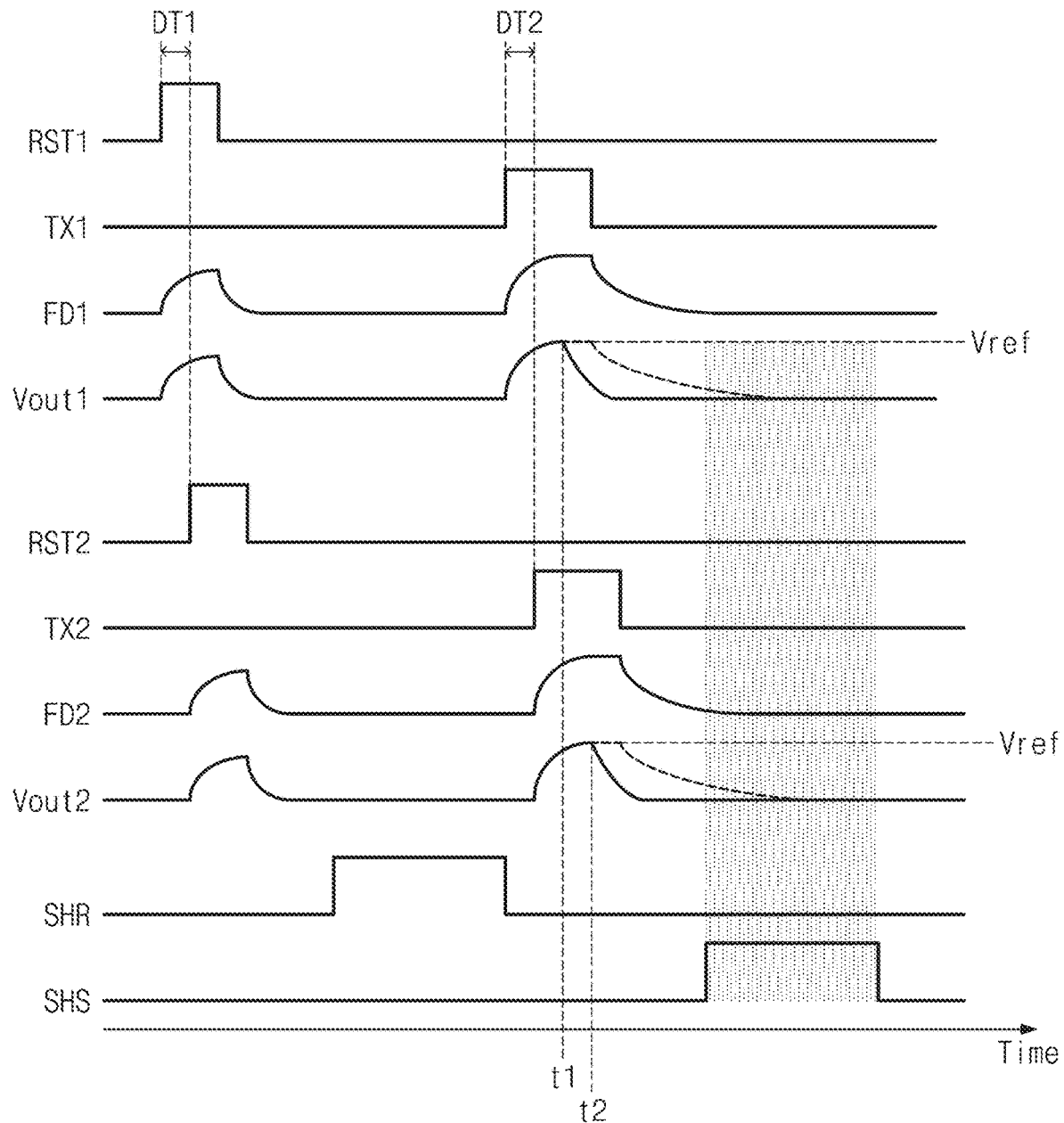
FIG. 9B is a timing diagram for describing operations of some components of an image sensor device of FIG. 9A.

FIG. 9A is a diagram illustrating a partial configuration of an image sensor device of FIG. 7 in detail. FIG. 9B is a timing diagram for describing operations of some components of an image sensor device of FIG. 9A.

Referring to FIGS. 9A and 9B, the first pixel PIX1 may be connected with the first data line DL1. The first pixel PIX1 may include a first photodiode PD1, a first transfer gate TG1, a first reset gate RG1, a first source follower SF1, and a first select gate SG1. The second pixel PIX2 may be connected to a second data line DL2. The second pixel PIX2 may include a second photodiode PD2, a second transfer gate TG2, a second reset gate RG2, a second source follower SF2, and a second select gate SG2. Configurations and operations of the first and second pixels PIX1 and PIX2 are similar to those described above, and thus, additional description will be omitted to avoid redundancy.

In some example embodiments, the first and second pixels PIX1 and PIX2 may be placed at the same row of the pixel array 110 and may operate within a 1H readout time. In some example embodiments, the 1H readout time may indicate a time for sampling reset data and pixel data from each of a plurality of pixels included in one row.

Each of the first current bias element CB1 and the first self-pull-down circuit SPD1 may be connected between the first node n1 and the ground voltage. Each of the second current bias element CB2 and the second self-pull-down circuit SPD2 may be connected between a second node n2 and the ground voltage. Configurations and operations of the first and second current bias elements CB1 and CB2 and the first and second self-pull-down circuits SPD1 and SPD2 are similar to those described above, and thus, additional description will be omitted to avoid redundancy.

In some example embodiments, as described with reference to FIGS. 5A and 5B, timings or waveforms of control signals (e.g., RST, TX, and RS) received from the row driver 220 may vary with physical locations of pixels. For example, the row driver 220 may output the reset signal RST, the transfer signal TX, and the row select signal RS in synchronization with a certain timing. In this case, the first pixel PIX1 may receive a first reset signal RST1, a first transfer signal TX1, and a first row select signal RS1, and the second pixel PIX2 may receive a second reset signal RST2, a second transfer signal TX2, and a second row select signal RS2.

Here, the first and second reset signals RST1 and RST2 may be RC-delayed signals of the reset signal RST from the row driver 220, the first and second transfer signals TX1 and TX2 may be RC-delayed signals of the transfer signal TX from the row driver 220, and the first and second row select signals RS1 and RS2 may be RC-delayed signals of the row select signal RS from the row driver 220. An RC delay of each control signal may be determined according to a relevant metal line.

In detail, as illustrated in FIG. 9B, the second reset signal RST2 may be delayed as much as a first delay time DT1 with respect to the first reset signal RST1, and the second transfer signal TX2 may be delayed as much as a second delay time DT2 with respect to the first transfer signal TX1. Each of the first and second delay times DT1 and DT2 may vary with a length or a layout of a relevant metal line. In some example embodiments, the first and second row select signals RS1 and RS2 are omitted in FIG. 9B for brevity of illustration.

That is, as illustrated in FIG. 9B, a time when the first transfer signal TX1 transitions to logical high and a time when the second transfer signal TX2 transitions to logical high may be different. In this case, a time when a voltage of a first floating diffusion node FD1 of the first pixel PIX1 is coupled and a time when a voltage of a second floating diffusion node FD2 of the second pixel PIX2 is coupled may be different.

Because the first and second self-pull-down circuits SPD1 and SPD2 according to some example embodiments of the inventive concepts operate based on levels of the first and second nodes n1 and n2, the first and second output voltages Vout1 and Vout2, or the first and second data lines DL1 and DL2, regardless of the timings of the first and second transfer signals TX1 and TX2 that the first and second pixels PIX1 and PIX2 receive, the first and second self-pull-down circuits SPD1 and SPD2 may normally pull down the levels of the first and second nodes n1 and n2, the first and second output voltages Vout1 and Vout2, or the first and second data lines DL1 and DL2.

For example, even though the timings of the first and second transfer signals TX1 and TX2 are different, the first self-pull-down circuit SPD1 may pull down the first node n1 at a first time t1 when the first output voltage Vout1 reaches the reference voltage Vref, and the second self-pull-down circuit SPD2 may pull down the second node n2 at a second time t2 when the second output voltage Vout2 reaches the reference voltage Vref. Accordingly, the first and second output voltages Vout1 and Vout2 may be quickly stabilized, and thus, reliability of a pixel sampling operation may be improved.

Figure 10:
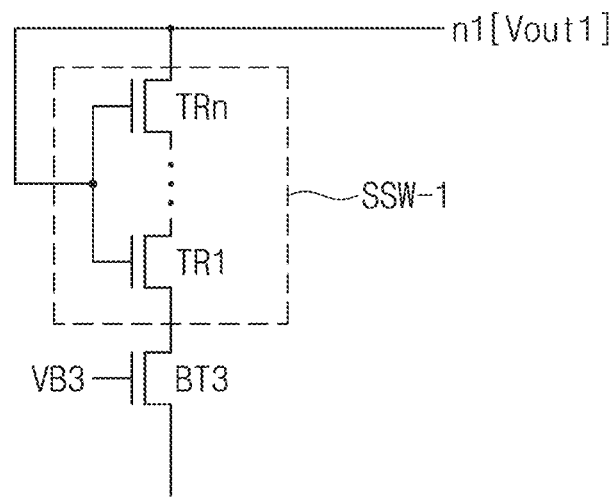
FIG. 10 is a diagram illustrating a self-pull-down circuit of FIG. 7.

FIG. 10 is a diagram illustrating a self-pull-down circuit of FIG. 7. For brevity of illustration and for convenience of description, one self-pull-down circuit SPD1-1 is illustrated in FIG. 10, but the inventive concepts are not limited thereto.

Referring to FIG. 10, a first self-pull-down circuit SPD1-1 may include the third bias transistor BT3 and a self-pull-down switch SSW-1. In some example embodiments, unlike the example embodiment of FIG. 8A, the self-pull-down switch SSW-1 of FIG. 10 may include a plurality of transistors TR1 to TRn.

For example, as described above, the self-pull-down switch SSW-1 may be configured to turn on when a voltage of the first node n1 reaches the reference voltage Vref. That is, a threshold voltage of the self-pull-down switch SSW-1 may be used as the reference voltage Vref. In some example embodiments, a threshold voltage of a general transistor may be determined according to a parameter such as a length or a width of a channel. That is, as the self-pull-down switch SSW-1 is implemented with the plurality of transistors TR1 to TRn, a threshold voltage of the self-pull-down switch SSW-1 may be easily adjusted. In other words, the plurality of transistors TR1 to TRn may be connected in various manners such that the self-pull-down switch SSW-1 operates at the intended reference voltage Vref.

In some example embodiments, an example where the plurality of transistors TR1 to TRn are connected in series is illustrated in FIG. 10, but the inventive concepts are not limited thereto. To implement an appropriate threshold voltage of the self-pull-down switch SSW-1, the plurality of transistors TR1 to TRn may be connected in series, in parallel, or in a serial and parallel manner.

Figure 11:
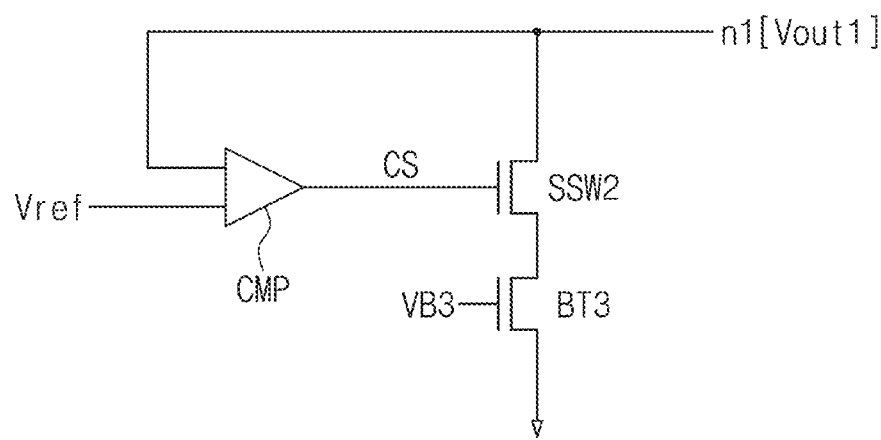
FIG. 11 is a diagram illustrating a self-pull-down circuit of FIG. 7.

FIG. 11 is a diagram illustrating a self-pull-down circuit of FIG. 7. For brevity of illustration and convenience of description, one self-pull-down circuit SPD1-2 is illustrated in FIG. 11, but the inventive concepts are not limited thereto.

Referring to FIG. 11, a self-pull-down circuit SPD1-2 may include a self-pull-down switch SSW-2, the third bias transistor BT3, and a comparator CMP. The third bias transistor BT3 may operate in response to the third bias voltage VB3.

In the above embodiments, the self-pull-down switch SSW may operate directly in response to a voltage of a relevant data line or a relevant output voltage, but the self-pull-down switch SSW-2 may operate in response to a comparison signal CS of the comparator CMP.

For example, the comparator CMP may be configured to compare a voltage of the first node n1 (i.e., the first output voltage Vout1) and the reference voltage Vref and to output the comparison signal CS as a comparison result. In some example embodiments, the comparator CMP may output the comparison signal CS of logical high when the voltage of the first node n1 reaches the reference voltage Vref. The self-pull-down switch SSW-2 may be turned on in response to the comparison signal CS of logical high. The following operations are similar to the above-described operations, and thus, additional description will be omitted to avoid redundancy.

Figure 12:
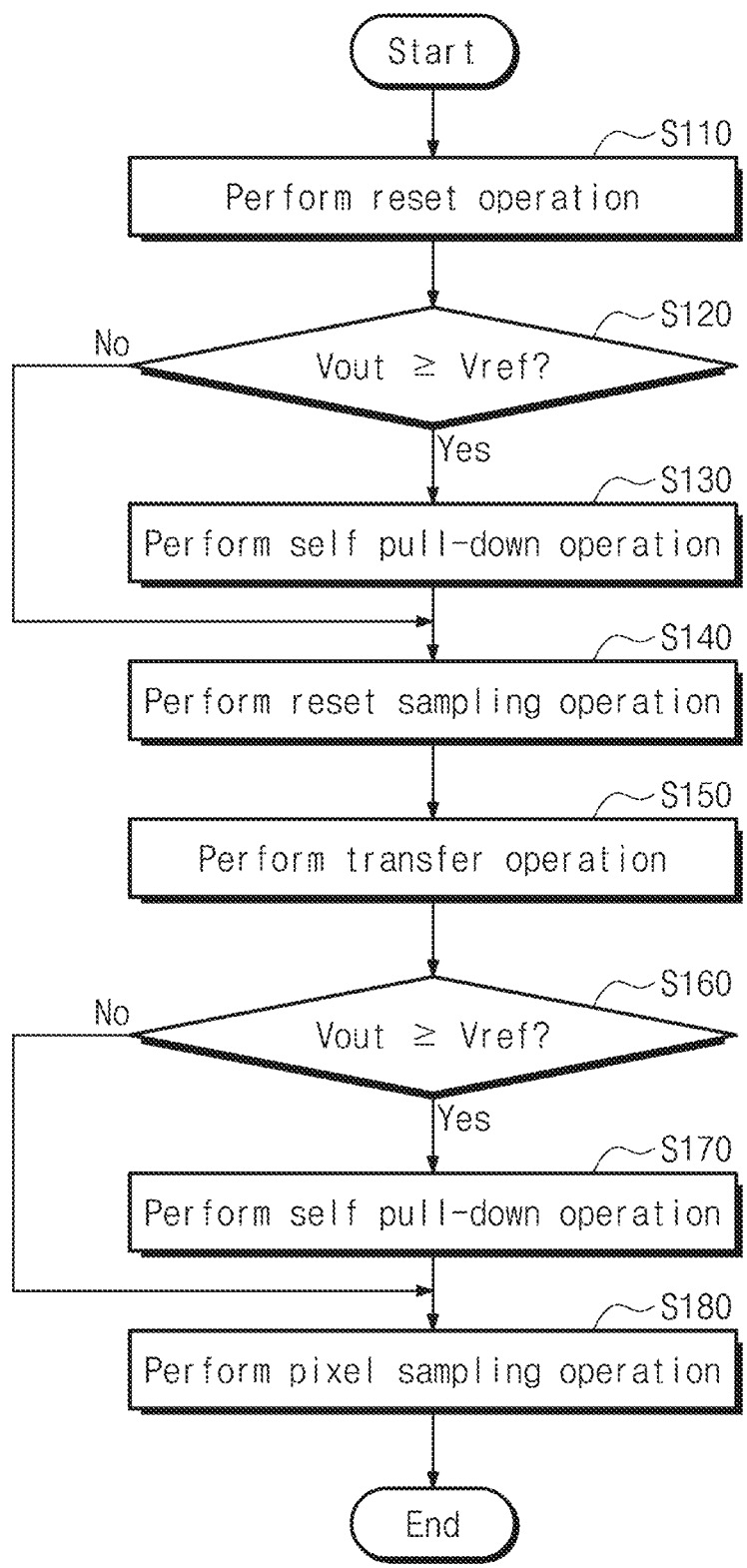
FIG. 12 is a flowchart illustrating an operation of an image sensor device according to some example embodiments.

FIG. 12 is a flowchart illustrating an operation of an image sensor device according to some example embodiments. For convenience of description, with regard to above-described components and operations, additional description will be omitted to avoid redundancy. Also, for convenience of description, an operation of the image sensor device 200 will be described with reference to one pixel, but the inventive concepts are not limited thereto. For example, the image sensor device 200 may repeatedly perform the operations of FIG. 12 in the unit of a row and may generate image data. Alternatively, the image sensor device 200 may repeatedly perform the operations of FIG. 12 in a given order and may generate image data.

Referring to FIGS. 6, 8A, and 12, in operation S110, the image sensor device 200 may perform a reset operation. For example, the image sensor device 200 may activate the reset signal RST (e.g., to logical high) such that a level of the floating diffusion node FD of a relevant pixel (hereinafter referred to as the "first pixel PIX1") is reset.

In operation S120, the image sensor device 200 may determine whether the first output voltage Vout1 is the reference voltage Vref or greater. When the first output voltage Vout1 is greater than the reference voltage Vref, in operation S130, the image sensor device 200 may perform a self-pull-down operation. For example, as described with reference to FIGS. 8A and 8B, when the first output voltage Vout1 reaches the reference voltage Vref (or is the reference voltage Vref or greater), the first self-pull-down circuit SPD1 may pull down the first data line DL1. That is, the self-pull-down operation may indicate the pull-down operation by the first self-pull-down circuit SPD1.

When the first output voltage Vout1 is smaller than the reference voltage Vref or after operation S130, in operation S140, the image sensor device 200 may perform the reset sampling operation. For example, in response to the reset sampling signal SHR, the CDS 250 may sample the first output voltage Vout1 to generate reset data. In some example embodiments, at a time when the reset sampling operation is performed, the first output voltage Vout1 may be in a state of being stabilized to a reset level.

Afterwards, in operation S150, the image sensor device 200 may perform a transfer operation. For example, the image sensor device 200 may activate the transfer signal TX (e.g., to logical high) such that charges are transferred from the photodiode PD of the first pixel PIX1 to the floating diffusion node FD.

Afterwards, the image sensor device 200 may perform operation S160 and operation S170. Operation S160 and operation S170 are similar to operation S120 and operation S130 above described, and thus, additional description will be omitted to avoid redundancy.

Afterwards, in operation S180, the image sensor device 200 may perform the pixel sampling operation. For example, in response to the pixel sampling signal SHS, the CDS 250 of the image sensor device 200 may sample the first output voltage Vout1 to generate pixel data. In some example embodiments, before the pixel sampling operation of the CDS 250 is performed, the first output voltage Vout1 may be in a state of being stabilized to a level equal to or lower than the reset level.

In some example embodiments, the CDS 250 may generate digital data (or image data) based on the reset data generated through the reset sampling operation and the pixel data generated through the pixel sampling operation.

As described above, an image sensor device, according to some example embodiments of the inventive concepts, may include a plurality of self-pull-down circuits respectively connected with a plurality of data lines. Each of the plurality of self-pull-down circuits may pull down a voltage of the corresponding data line in response to the voltage of the corresponding data line without a separate control signal. Accordingly, because the self-pull-down circuit SPD operates individually or independently in response to a voltage of the corresponding data line, there may be no need to consider a timing for a separate control signal (e.g., PDC). This may mean that the implementation of the image sensor device may be simplified and an error of an output voltage due to the coupling with a certain signal line may be efficiently removed.

Figure 13:
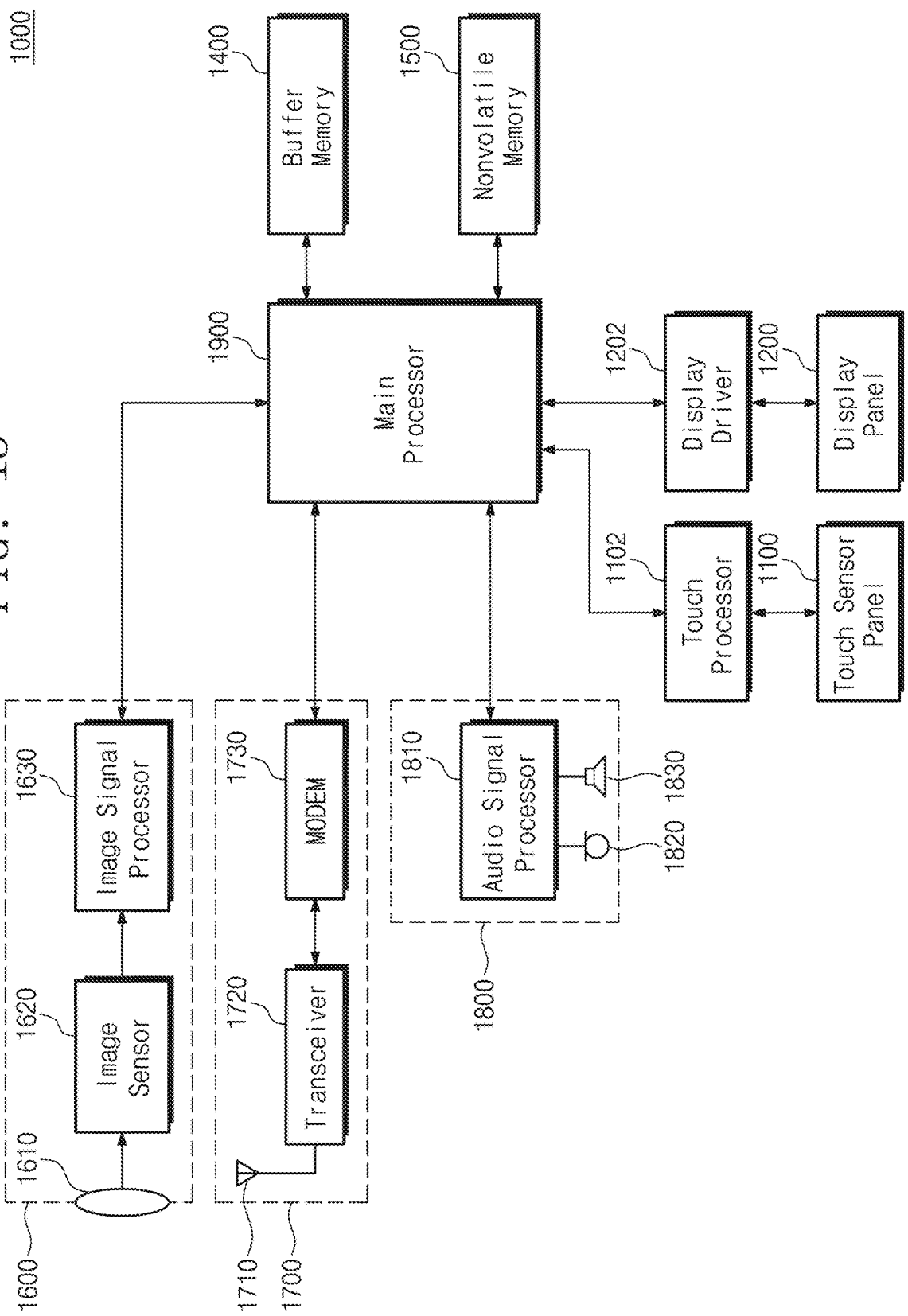
FIG. 13 is a block diagram illustrating an electronic device including an image sensor device according to some example embodiments.

FIG. 13 is a block diagram illustrating an electronic device including an image sensor device according to some example embodiments. Referring to FIG. 13, an electronic device 1000 may include a touch sensor panel 1100, a touch processor 1102, a display panel 1200, a display driver 1202, a buffer memory 1400, a nonvolatile memory 1500, an image processor 1600, a communication block 1700, an audio processor 1800, and a main processor 1900. For example, the electronic device 1000 may be one of various electronic devices such as a portable communication terminal, a personal digital assistant (PDA), a portable media player (PMP), a digital camera, a smartphone, a tablet computer, a laptop computer, and a wearable device.

The touch sensor panel 1100 may be configured to sense a touch from a user under control of the touch processor 1102. The display panel 1200 may be configured to display screen information to the user under control of the display driver 1202.

The buffer memory 1400 may store data that are used for an operation of the electronic device 1000. For example, the buffer memory 1400 may temporarily store data processed or to be processed by the main processor 1900. For example, the buffer memory 1400 may include a volatile memory such as a static random access memory (SRAM), a dynamic RAM (DRAM), or a synchronous DRAM (SDRAM), and/or a nonvolatile memory such as a phase-change RAM (PRAM), a magneto-resistive RAM (MRAM), a resistive RAM (ReRAM), or a ferroelectric RAM (FRAM).

The nonvolatile memory 1500 may store data regardless of whether a power is supplied. For example, the nonvolatile memory 1500 may include at least one of various nonvolatile memories such as a flash memory, a PRAM, an MRAM, a ReRAM, and a FRAM. For example, the nonvolatile memory 1500 may include an embedded memory and/or a removable memory of the electronic device 1000.

The image processor 1600 may receive a light through a lens 1610. An image sensor 1620 and an image signal processor 1630 included in the image processor 1600 may generate image information about an external object, based on the received light. In some example embodiments, the image sensor 1620 may be one of the image sensor devices described with reference to FIGS. 1 to 11.

The communication block 1700 may exchange signals with an external device/system through an antenna 1710. A transceiver 1720 and a modulator/demodulator (MODEM) 2730 of the communication block 1700 may process signals exchanged with the external device/system, based on at least one of various wireless communication protocols: long term evolution (LTE), worldwide interoperability for microwave access (WiMax), global system for mobile communication (GSM), code division multiple access (CDMA), Bluetooth, near field communication (NFC), wireless fidelity (Wi-Fi), and radio frequency identification (RFID).

The audio processor 1800 may process an audio signal by using an audio signal processor 1810. The audio processor 1800 may receive an audio input through a microphone 1820 or may provide an audio output through a speaker 1830.

The main processor 1900 may control overall operations of the electronic device 1000. A main processor 1900 may control/manage operations of the components of the electronic device 1000. The main processor 1900 may process various operations for the purpose of operating the electronic device 1000.

According to some example embodiments of the inventive concept, an image sensor device may include a self-pull-down circuit configured to perform a self-pull-down operation in response to a voltage of a relevant data line. Because self-pull-down circuits operate individually or independently with respect to respective data lines, a separate control signal for controlling the self-pull-down circuits is not required. Accordingly, the layout of metal lines for control signals is simplified; because there is no need to consider a timing of a control signal, the image sensor device having improved reliability may be easily implemented. Accordingly, an image sensor device having improved reliability and improved performance and an operation method thereof are provided.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

While the inventive concepts have been described with reference to some example embodiments thereof, it will be apparent to those of ordinary skill in the art that various changes and modifications may be made thereto without departing from the spirit and scope of the inventive concepts as set forth in the following claims.

What is claimed is:

1. An image sensor device comprising:
   a pixel configured to
     convert a light signal into an electrical signal, and
     output the converted electrical signal through a data line;
   a current bias element connected between the data line and a ground voltage; and
   a self-pull-down circuit connected between the data line and the ground voltage, the self-pull-down circuit configured to pull down the data line based on an output voltage of the data line, the current bias element and the self-pull-down circuit being connected in parallel.

2. The image sensor device of claim 1, wherein the self-pull-down circuit is configured to pull down the output voltage of the data line when the output voltage reaches a reference voltage.

3. The image sensor device of claim 1, wherein the self-pull-down circuit includes:
   a first bias transistor connected between a first node and the ground voltage, the first bias transistor being configured to operate in response to a first bias voltage; and
   a self-pull-down switch connected between the data line and the first node, the self-pull-down switch being configured to operate in response to the output voltage of the data line.

4. The image sensor device of claim 3, wherein
   the self-pull-down switch includes at least one transistor between the data line and the first node in a serial manner, in a parallel manner, or in a serial and parallel manner, and
   the at least one transistor is configured to operate in response to the output voltage.

5. The image sensor device of claim 1, wherein the self-pull-down circuit includes:
   a first bias transistor connected between a first node and the ground voltage, the first bias transistor being configured to operate in response to a first bias voltage;
   a comparator configured to compare the output voltage and a reference voltage and output a comparison signal based on the comparison; and
   a self-pull-down switch connected between the data line and the first node, the self-pull-down switch configured to operate in response to the comparison signal.

6. The image sensor device of claim 1, further comprising:
   a row driver configured to provide at least one of a transfer signal, a reset signal, and a row select signal to the pixel;
   a control logic circuit configured to
     control the row driver, and
     output a reset sampling signal and a pixel sampling signal; and
   a correlated double sampling circuit configured to generate a digital signal based on sampling the output voltage of the data line in response to the reset sampling signal and the pixel sampling signal.

7. The image sensor device of claim 6, wherein the pixel includes:
   a photodiode configured to accumulate charges in response to the light signal;
   a transfer gate connected between the photodiode and a floating diffusion node, the transfer gate configured to operate in response to the transfer signal;
   a reset gate connected between a power supply voltage and the floating diffusion node, the reset gate configured to operate in response to the reset signal;
   a source follower connected between the power supply voltage and a first node, the source follower configured to operate in response to a voltage of the floating diffusion node; and a row select gate connected between the first node and the data line, the row select gate configured to operate in response to the row select signal.

8. The image sensor device of claim 7, wherein, in a period where the transfer signal is at logical high, when the output voltage reaches a reference voltage, the self-pull-down circuit is configured to pull down the data line.

9. The image sensor device of claim 7, wherein, the self-pull-down circuit is configured to pull down the data line before the correlated double sampling circuit initiates an operation of sampling the output voltage from the data line.

10. The image sensor device of claim 9, wherein the output voltage pulled down by the self-pull-down circuit is lower than or equal to a reset level of the pixel.

11. The image sensor device of claim 10, wherein the reset level indicates the output voltage of the data line in a state where the floating diffusion node is charged with the power supply voltage by the reset gate.

12. An image sensor device comprising:
    a row driver configured to output pixel control signals;
    a first pixel connected with a first data line,
        the first pixel being configured to, in response to the pixel control signals, convert a first light signal into a first electrical signal and output the first electrical signal through the first data line;
    a second pixel connected with a second data line,
        the second pixel being configured to, in response to the pixel control signals, convert a second light signal into a second electrical signal and output the second electrical signal through the second data line;
    a first self-pull-down circuit connected between the first data line and a ground voltage, the first self-pull-down circuit being configured to operate in response to a first output voltage of the first data line,
    a first current bias element connected between the first data line and a ground voltage, the first current bias element and the first self-pull-down circuit being connected in parallel; and
    a second self-pull-down circuit connected between the second data line and the ground voltage, the second self-pull-down circuit being configured to operate in response to a second output voltage of the second data line.

13. The image sensor device of claim 12, wherein
the pixel control signals include a reset signal, a transfer signal, and a row select signal,
the first pixel includes
    a first photodiode configured to accumulate charges in response to the first light signal;
    a first transfer gate connected between the first photodiode and a first floating diffusion node, the first transfer gate configured to operate in response to the transfer signal;
    a first reset gate connected between a power supply voltage and the first floating diffusion node, the first reset gate configured to operate in response to the reset signal;
    a first source follower connected between the power supply voltage and a first node, the first source follower configured to operate in response to a voltage of the first floating diffusion node; and
    a first row select gate connected between the first node and the first data line, the first row select gate configured to operate in response to the row select signal, and
the second pixel includes a second photodiode configured to accumulate charges in response to the second light signal;
a second transfer gate connected between the second photodiode and a second floating diffusion node, the second transfer gate configured to operate in response to the transfer signal;
a second reset gate connected between the power supply voltage and the second floating diffusion node, the second reset gate configured to operate in response to the reset signal;
a second source follower connected between the power supply voltage and a second node, the second source follower configured to operate in response to a voltage of the second floating diffusion node; and
a second row select gate connected between the second node and the second data line, the second row select gate configured to operate in response to the row select signal.

14. The image sensor device of claim 13, wherein
the first self-pull-down circuit is configured to pull down the first data line when the first output voltage reaches a reference voltage,
the second self-pull-down circuit is configured to pull down the second data line when the second output voltage reaches the reference voltage, and
a time when the first output voltage reaches the reference voltage is different from a time when the second output voltage reaches the reference voltage.

15. The image sensor device of claim 13, further comprising:
    a control logic circuit configured to control the row driver and to output a reset sampling signal and a pixel sampling signal; and
    a correlated double sampling circuit connected with the first and second data lines,
    wherein, in response to the reset sampling signal and the pixel sampling signal, the correlated double sampling circuit is configured to perform sampling operations on the first output voltage and the second output voltage to generate digital data.

16. The image sensor device of claim 15, wherein
the first self-pull-down circuit is configured to initiate an operation of pulling down the first data line between a first time when the transfer signal arrives at the first transfer gate and a second time when the pixel sampling signal transitions to logical high, and
the second self-pull-down circuit is configured to initiate an operation of pulling down the second data line between a third time when the transfer signal arrives at the second transfer gate and the second time.

17. The image sensor device of claim 12, further comprising:
    a first current bias element connected with the first data line, the first current bias element configured to operate in response to first bias voltages; and
    a second current bias element connected with the second data line, the second current bias element configured to operate in response to second bias voltages.

18. An operation method of an image sensor device which includes a pixel configured to convert a light signal into an electrical signal and to output the converted electrical signal through a data line, the method comprising:
    performing a reset operation on the pixel;
    performing a reset sampling operation on the data line to generate reset data;
    performing a transfer operation on the pixel;

performing a pixel sampling operation on the data line to generate pixel data; and performing a self-pull-down operation for the data line based on an output voltage of the data line being greater than or equal to a reference voltage, the performing a self-pull-down operation being during a first period from a time when the reset operation is performed to a time when the reset sampling operation is initiated, or a second period from a time when the transfer operation is performed to a time when the pixel sampling operation is initiated.

19. The method of claim 18, wherein the pixel includes:

a photodiode configured to accumulate charges in response to the light signal;

a transfer gate connected between the photodiode and a floating diffusion node, the transfer gate configured to operate in response to the transfer signal;

a reset gate connected between a power supply voltage and the floating diffusion node, the reset gate configured to operate in response to the reset signal;

a source follower connected between the power supply voltage and a first node, the source follower configured to operate in response to a voltage of the floating diffusion node; and a row select gate connected between the first node and the data line, the row select gate configured to operate in response to a row select signal.

20. The method of claim 19, wherein the reset operation is performed by allowing the reset signal to transition to logical high, and the transfer operation is performed by allowing the transfer signal to transition to logical high.

* * * * *